United States Patent [19]

Tanaka

[11] Patent Number: 5,212,653
[45] Date of Patent: May 18, 1993

[54] METHOD FOR PRODUCING A LAYOUT OF ELEMENT PORTIONS FOR A SEMICONDUCTOR INTEGRATED CIRCUIT USING A COMPUTER

[75] Inventor: Makoto Tanaka, Osaka, Japan

[73] Assignee: Matsushita Electronics Corporation, Osaka, Japan

[21] Appl. No.: 658,620

[22] Filed: Feb. 21, 1991

[30] Foreign Application Priority Data

Feb. 21, 1990 [JP] Japan .................................. 2-41425

[51] Int. Cl.$^5$ ............................................. G06F 15/60
[52] U.S. Cl. .................................. 364/491; 364/490; 364/489; 364/488
[58] Field of Search ................. 364/488, 489, 490, 491

[56] References Cited

U.S. PATENT DOCUMENTS

| | | | |
|---|---|---|---|
| 4,613,940 | 9/1986 | Shenton et al. | 364/491 |
| 4,636,966 | 1/1987 | Yamada et al. | 364/491 |
| 4,694,403 | 9/1987 | Nomura | 364/491 |
| 4,823,278 | 4/1989 | Kikuchi et al. | 364/491 |
| 4,839,821 | 6/1989 | Murakata | 364/491 |
| 4,890,238 | 12/1989 | Klein et al. | 364/491 |
| 4,903,214 | 2/1990 | Hiwatashi | 364/491 |
| 4,908,772 | 3/1990 | Chi | 364/491 |
| 5,038,294 | 8/1991 | Arakawa et al. | 364/491 |

OTHER PUBLICATIONS

"Automatic Placement A Review of Current Techniques" by Preas et al., IEEE 23rd Design Automation Conf., Jun. 29–Jul. 2, 1986, pp. 622–629.

"Automatic Placement and Routing of Gate Arrays" by G. Rabson, VLSI Design, Apr. 1984, pp. 35–43.

"Automatic Generation of Digital System Schematic Diagrams" by Arya et al., IEEE 22nd Design Automation Conf., 1985, pp. 388–395.

Primary Examiner—Vincent N. Trans
Attorney, Agent, or Firm—Lowe, Price, LeBlanc & Becker

[57] ABSTRACT

A method for producing layout comprises the steps of: producing power line and other blocks according to inputted circuit configuration data represent kind, attribute data and element to be included in the semiconductor integrated circuit; determining kind of element portions arranged at each of the blocks according to the total area of each kind of the element portion in each block; moving the different kind of element portion in each block to one of blocks including the same kind of element portion; and arranging the element portions according to the data of a horizontal position. For obtaining a vertical length of each block, a minimum lengths of resistor and capacitor blocks are inputted; then the actual vertical length of the transistor block is determined; and then final vertical lengths of resistor and capacitor blocks are determined. A resistor or capacitor is modified in its shape if it has large length than the determined vertical length. A resistor or capacitor with large area is made with full vertical length of the layout. Other components are arranged between full vertical length blocks.

16 Claims, 12 Drawing Sheets

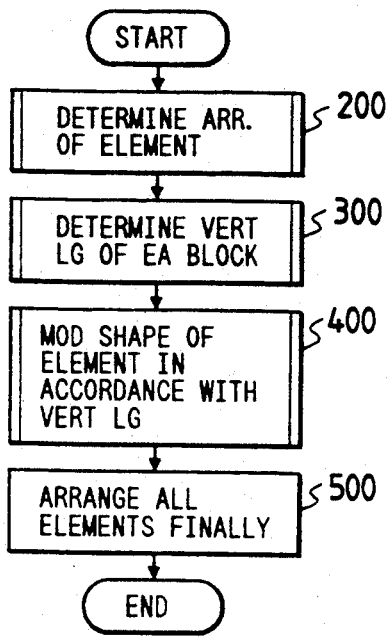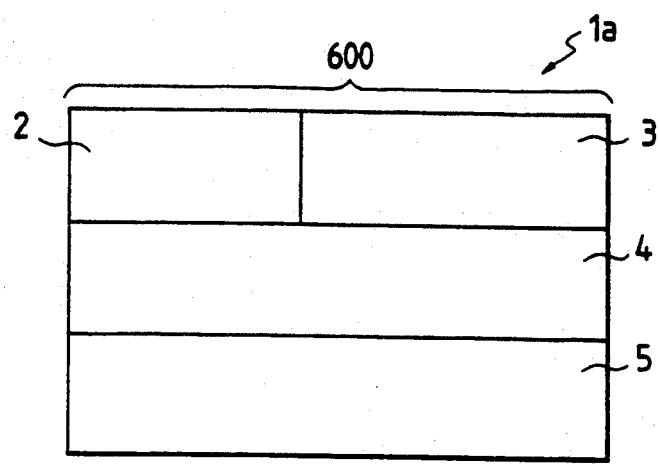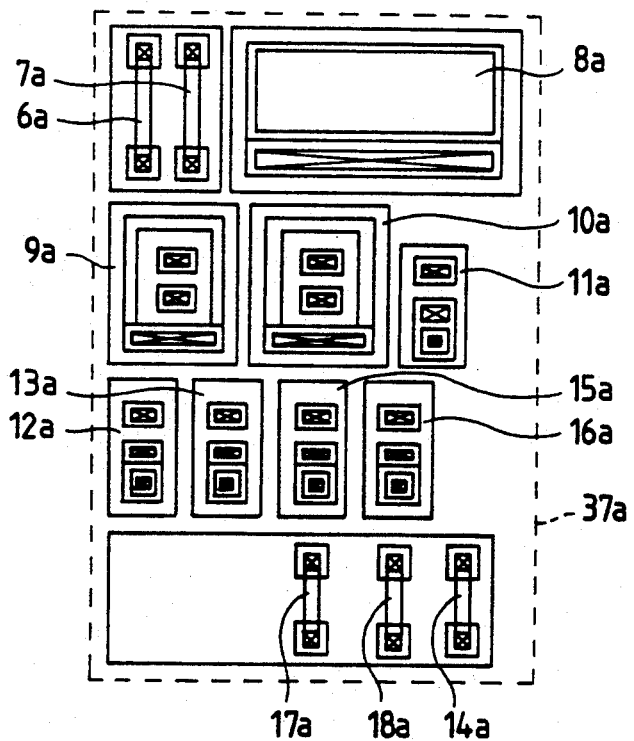

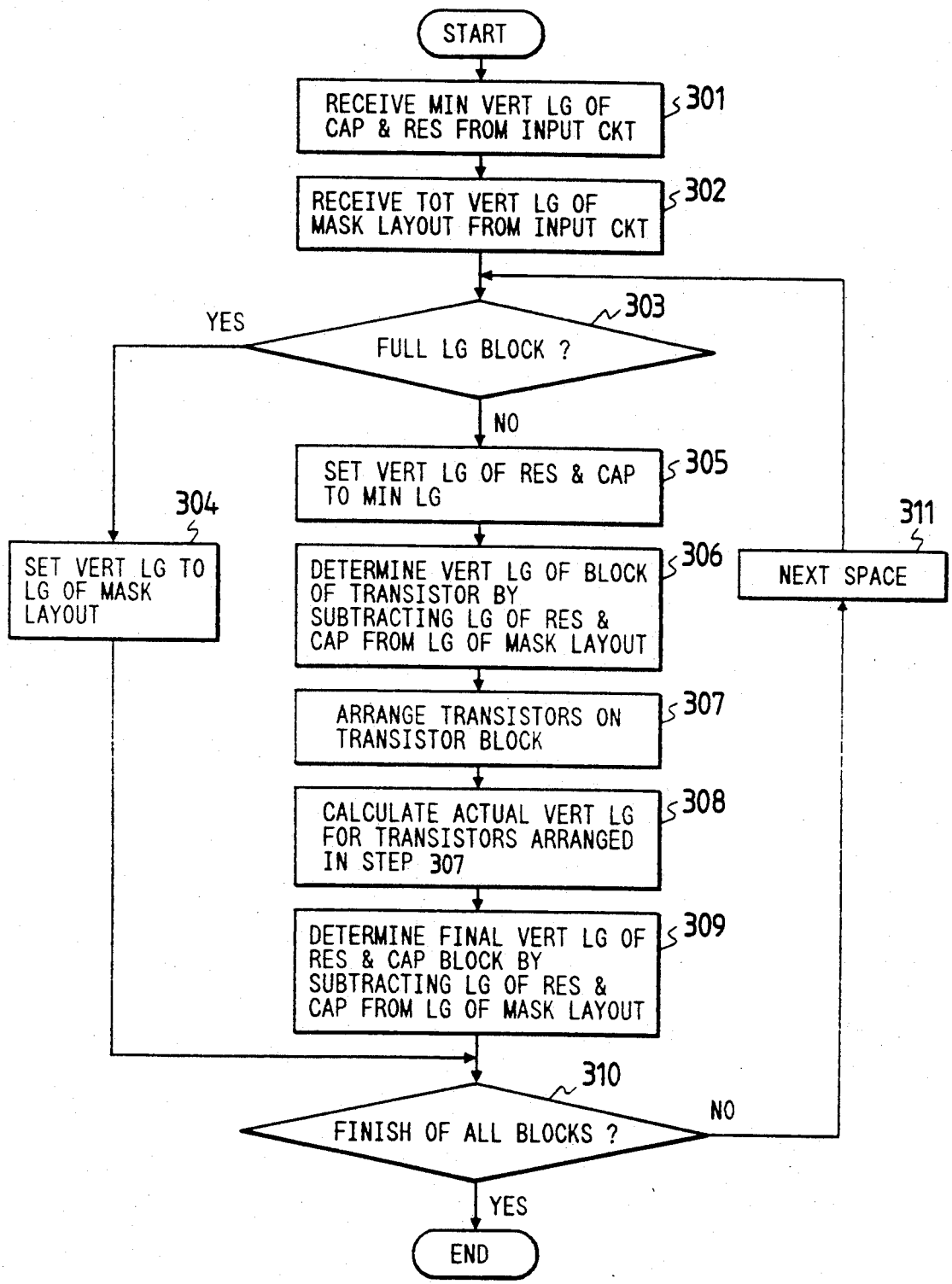

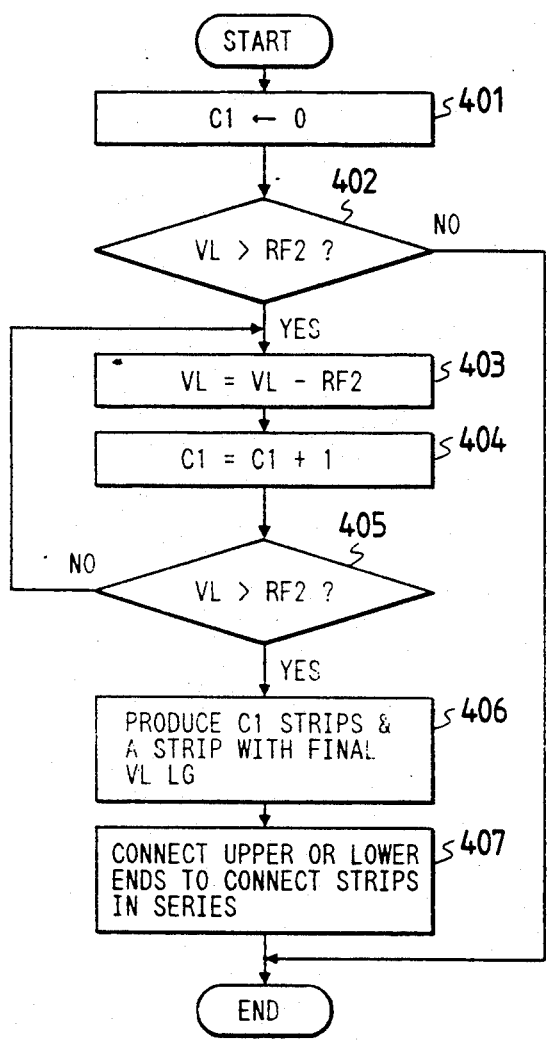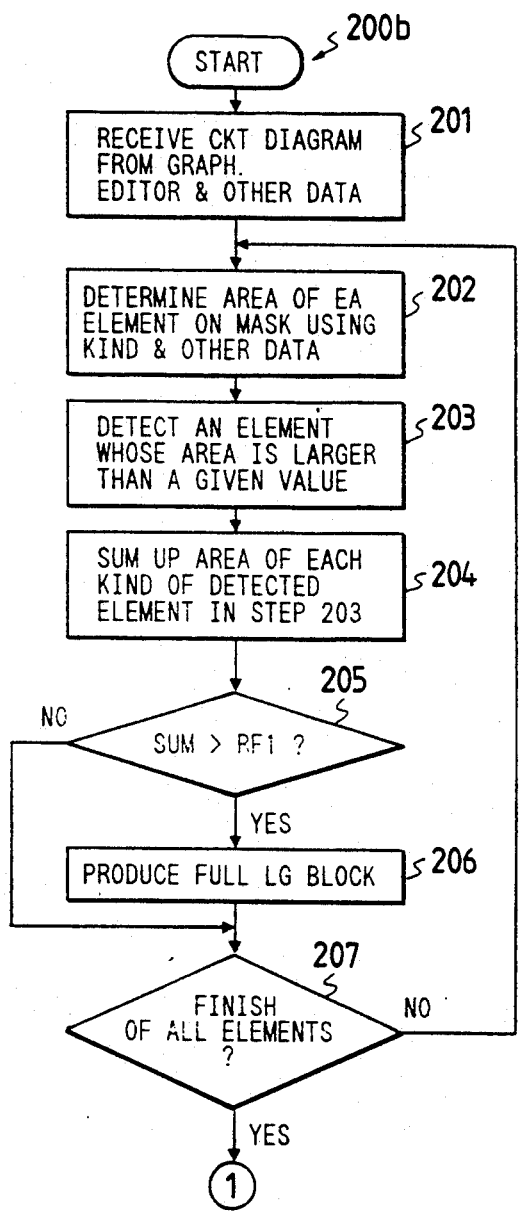

METHOD FOR PRODUCING A LAYOUT OF ELEMENT PORTIONS FOR A SEMICONDUCTOR INTEGRATED CIRCUIT USING A COMPUTER

BACKGROUND OF THE INVENTION

1. Field of the Invention

This invention relates to a method for producing a layout of element portions for a semiconductor integrated circuit, using a computer.

2. Description of the Prior Art

A method for producing a layout of element portions of a semiconductor integrated circuit, using a computer, provides a layout of element portions of a semiconductor integrated circuit by arranging each element portion in accordance with relative position relation to other element portion in a circuit diagram. Such prior method will be described using FIGS. 17 and 18. FIG. 17 shows a schematic circuit diagram of a given circuit. FIG. 18 is a layout of semiconductor element portions provided by this prior art method. As shown in FIGS. 17 and 18, each element portion is arranged in accordance with a position relation to other element portions in the schematic circuit diagram. The corresponding element portions or parts are designated as like references between FIGS. 17 and 18. However, there is a drawback that there is a tendency that a dead space between element portions becomes larger if such prior art method is applied to providing a layout of a bipolar semiconductor integrated circuit. One of reasons is that in the bipolar semiconductor integrated circuit, an isolating diffused layer is necessary between each element portion. Moreover, in the prior method, there is also a drawback that a dead space between element portions becomes larger when a large amount of a capacity or resistance is arranged. This is because the amount of capacitance and resistance are determined by extending a basic pattern of a capacitor or a resistor in one direction.

SUMMARY OF THE INVENTION

The present invention has been developed in order to remove the above-described drawbacks inherent to the conventional method for providing a layout of element portions for a semiconductor integrated circuit, using a computer.

According to the present invention there is provided a first method for producing a layout of element portions for a semiconductor integrated circuit on the basis of inputted circuit configuration data which represent kind, attribute data and location of each element portion to be included in the semiconductor integrated circuit, using a computer, comprising the steps of: producing blocks arranged side by side in the one direction such that one or more blocks include element portions to be directly connected to a common line in the semiconductor integrated circuit; obtaining total area of the element portions in connection with each kind in each of the blocks; determining kind of element portions to be arranged in each of the blocks in accordance with the total area obtained in connection with the each kind; detecting one or more element portion different from the determined kind of the element portions in each of the blocks if any; transferring the detected different kind of element portion in the each block to one of blocks including the same kind of the element portions arranged; and for each of the blocks arranging the element portions determined after the step of transferring so that each element portion is located at a suitable position in accordance with the location data of the element portions to produce the layout.

According to the present invention there is also provided a second method as mentioned in the first method, further comprising the steps of: receiving a minimum length of first blocks of the blocks, to which the resistor portions or the capacitor portions are assigned and a total length of the blocks; tentatively determining length of the first blocks; tentatively determining a length of a second block of the blocks in accordance with difference between the total length of blocks and length of the first blocks, to which the transistor portions are assigned, in accordance with the maximum length of the transistor portions determined by the kind and attribute data; and finally determining length of the first blocks in accordance with difference between the length of the second block and the total length of the blocks.

According to the present invention there is also provided a third method as mentioned in the second method, further comprising the step of: modifying a shape of one of the elements when a length of the one of the elements obtained through calculation in accordance with the attribute data of one of the elements exceeds the vertical length determined.

According to the present invention there is further provided a fourth method for producing a layout of element portions for a semiconductor integrated circuit on the basis of inputted circuit configuration data which represent kind, attribute data and location of each element portion to be included in the semiconductor integrated circuit, using a computer, comprising the steps of: obtaining a vertical length of the element portions in accordance with input circuit configuration data; detecting an element portion whose obtained vertical length exceeds a given value; producing a first block with full vertical length in response to detection of the element; separating the circuit into plural vertically extending sections such that a boundary between two consecutive sections being defined by the horizontal position of the element portion detected in the second step; producing a set of second blocks for arranging the element portions belonging to the each section other than sections including the element portion detected in the first step, the second blocks being arranged side by side in the vertical direction such that one or more blocks include element portions to be directly connected to a common line in the semiconductor integrated circuit; obtaining total area of the element portions in connection with each kind in each of the blocks, area of each element portion being selected in accordance with the kind of and the attribute data of the each element portion; determining kind of element portions to be arranged in each of the blocks in accordance with the total area obtained in connection with the each kind; detecting one or more element portion different from the determined kind of the element portions in each of the blocks if any; transferring the detected different kind of element portion in the each block to one of blocks including the same kind of the element portions arranged; and for each of the blocks arranging the element portions determined after the step of transferring so that each element portion is located at a suitable position in accordance with the location data of the element portions to produce the layout.

BRIEF DESCRIPTION OF THE DRAWINGS

The object and features of the present invention will become more readily apparent from the following detailed description taken in conjunction with the accompanying drawings in which:

FIG. 3 shows a main flow chart of this invention which is common to all embodiment;

FIG. 5 shows a rough layout of a first embodiment;

FIG. 6 shows a layout of element portion according to the first embodiment;

FIG. 9 shows a flow chart of a subroutine step 300 in FIG. 3 in a second embodiment;

FIG. 10 shows a flow chart of a subroutine of the step 400 shown in FIG. 3 in a third embodiment;

The same or corresponding element portions or parts are designated as like references throughout the drawings.

DETAILED DESCRIPTION OF THE INVENTION

Hereinbelow will be described embodiments of this invention.

Figure 1:
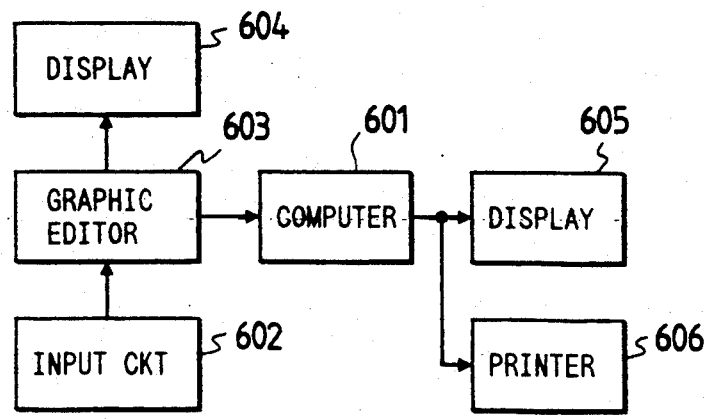
FIG. 1 is a block diagram of a system for producing a layout of element portions of a semiconductor integrated circuit using a computer, which is common to all embodiments.

FIG. 1 is a block diagram of a system for producing a layout of element portions of a semiconductor integrated circuit using a computer, which is common to all embodiments.

In FIG. 1, an operator (not shown) operates an input circuit 602 to produce a circuit diagram in a graphic editor 603 so that the produced circuit diagram corresponds to a prepared circuit diagram. The produced circuit diagram is displayed on a display 604 to provide a graphic image to the operator. The operator also inputs other data descriptive of each of element portions included in the produced circuit diagram. The term "element portion" means a portion where an element, for example, a resistor, a capacitor, or a transistor is to be formed on the integrated circuit or a mask layout.

Figure 2:
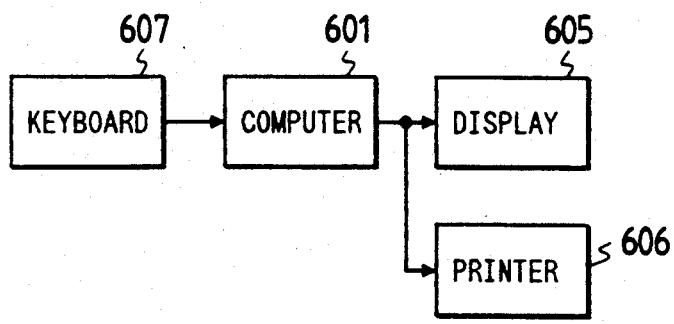
FIG. 2 is also a block diagram of a system for producing a layout of element portions of a semiconductor integrated circuit using a computer, which is common to all embodiments.

The graphic editor 603 sends the produced circuit diagram and other data to a computer 601. In other words, the operator inputs the prepared circuit diagram into the computer 601. The computer 601 generates a layout of a semiconductor integrated circuit from the produced circuit diagram and other data in accordance with a program stored therein. The layout generated by the computer 601 sends a picture image of the layout to a display 605 or a printer 606. The display 605 displays the layout of a semiconductor integrated circuit thereon and the printer 606 provides a hard copy of the layout. The operator inputs the data descriptive of element portions such that a resistance is inputted for a resistor (not shown); a capacitance, for a capacitor (not shown); current capacitance and other data, for a transistor (not shown). The computer 601 detects the position of an element portion of the produced circuit diagram in X and Y axes and connection relation of an element portion to a common line and to other element portions. More specifically, the computer 601 detects whether an element portion is connected to a power supply line or a ground line, or other line. Moreover, the computer 601 calculates wiring length of the element portion to another element portion by means of well-known technique and detects whether an element portions should be arranged adjacent to another element portion. For example, a pair transistors should be located adjacent to each other. However, the prepared circuit diagram can be inputted manually. FIG. 2 is also a block diagram of the system of providing the layout of element portions of the semiconductor integrated circuit. The operator inputs a kind of an element portion, connection relation, other data, for example, resistance, position data, and the pair of the element portion through a keyboard 607.

Hereinbelow will be described a first embodiment of this invention.

Figure 7:
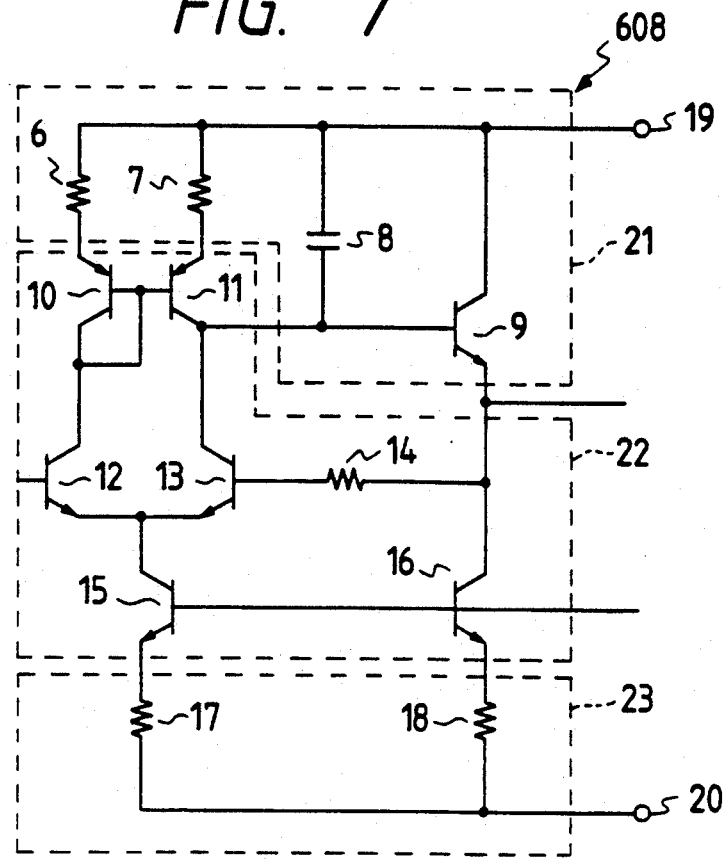
FIG. 7 is a circuit diagram to be arranged in the first embodiment.

For example, if the operator inputs a circuit diagram 608 to be arranged shown in FIG. 7 to the computer 601 through the graphic editor 603 or the keyboard 607, the computer 601 produces a clump 1a of blocks including the upper block 600, the lower block 5 (with respect to the direction of the drawing placed) and a middle blocks 4 shown in FIG. 5 showing a rough layout and then produces a layout shown in FIG. 6.

The computer 601 produces the layout of element portions included in a circuit diagram in accordance with a main flow chart of FIG. 3. In FIG. 3, the computer 601 determines arrangement of element portions of the produced circuit diagram in a subroutine step 200. In this embodiment, steps 300 and 400 are not executed. Thus, processing proceeds to step 500. In step 500, the computer 601 finally arranges all element portions and produces and displays the layout by replacing predetermined patterns of element portions with arranged element portions. The processing stops after execution of the step 500.

Figure 4:
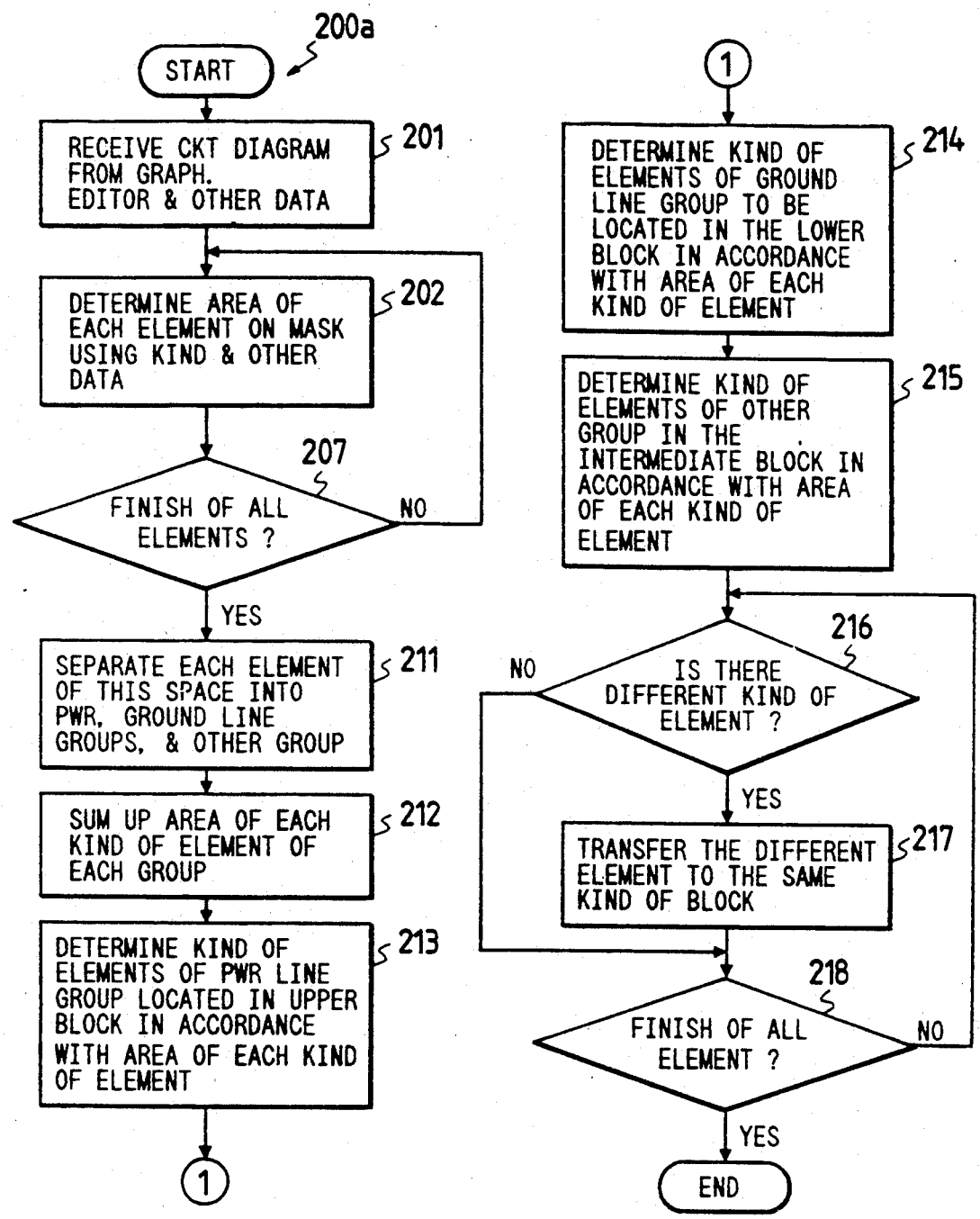
FIG. 4 shows a flow chart of a subroutine of step 200 shown in FIG. 3.

FIG. 4 shows a flow chart of a subroutine of step 200 shown in FIG. 3. In FIG. 4, processing starts in step 201. In step 201, the computer 601 receives the produced circuit diagram and other data from the graphic editor 603 or circuit-diagram data and other data from the keyboard 607. In the following step 202, the computer 601 determines area of each element portion on a mask using kind and other data of element portions. For example, area of a transistor is determined by multiplying a vertical length by a horizontal length which are manually inputted. As to resistors and capacitors, areas are calculated on the basis of resistance and capacitance respectively. In following step 207, the computer 601 makes a decision as to whether processing is executed for all element portions of the produced circuit. If NO, processing returns to step 202 and continue processing of a routing including steps 202-207 until finish of processing of all element portions. The computer 601 separates each element portion of this space into power, ground line groups, and other group in accordance with connection relation in step 211. In this example, the computer 601 separates the circuit diagram of FIG. 7 into a power line group 21 where all element portions are connected to a power supply terminal 19, a ground line group 23 where all element portions are connected to the ground terminal 20 and other group 22, as shown in FIG. 7. Processing proceeds to step 212. In step 212, the computer 601 sums up area of each kind of element portion of each group. The computer 601 determines a kind of element portions to be arranged at the upper block 600 in accordance with the total area of each kind of element portions of the group in step 213. In the upper block 600, a kind of element portions with the largest area out of element portions of the power line group are arranged. In this example, the capacitor 8 has the largest area in the power line group 21. A kind of element portions with the second largest area is a resistor. Therefore, in the upper block 600 of a clump 1a of blocks of FIG. 5, the resistor block 2 and capacitor block 3 are arranged. In the resistor block 2, resistors 6 and 7 are arranged, in the capcitor block 3, capacitor 8 is arranged. Similarly, in step 214, the computer 601 determines a kind of element portions to be arranged at the lower block 5 in accordance with the total area of each kind of element portions of the ground line group 23. In the lower block 5, a kind of element portions with the largest area out of element portions of the ground line group are arranged, namely, resistors 17 and 18. The computer 601 determine a kind of element portions to be arranged at the middle block 4 in accordance with the total area of each kind of element portions of the rest group in step 215. In the middle block 4, a kind of element portions with the largest area out of element portions of the group are arranged. In this example, the transistors 10-13, 15, and 16 have the largest area. Therefore, in the middle block 4, the transistors 10-13, 15, and 16 are arranged. In the following step 216, the computer 601 detects whether there is a different kind of element portion in each block. If YES, in step 217, the computer 601 transfers the different kind of element portion to the block where the same kind of element portions are arranged. Actually, at first, the computer 601 detects which block in this space is assigned to the same kind of element portion as the different kind of element portion is detected in step 216. Then, the computer 601 moves the different kind of element portion to the detected block. In this example, the transistor 9 is moved to the middle block 4 because it is better that the same kind of element portions are included in the same block from electric characteristic view. Similarly, the resistor 14 is moved to the lower block 5. In step 218, the computer 601 makes a decision as to whether all element portions have been checked. If NO, processing returns to step 216 until all element portions have been checked. If YES, processing ends this subroutine and returns to step 300 of the main routine. In the following step 500, the computer 601 arranges all element portions at a suitable position such that each element portion belongs to one block is arranged in accordance with its x and y positions. Then, the computer 601 produces a layout 37a of the semiconductor integrated circuit diagram shown in FIG. 6.

The same or corresponding element portions or parts in FIGS. 6 and 7 are designated as like references.

As mentioned above, in this embodiment, each element portion is separated into plural groups in accordance with connection relation to power line, ground line and other groups. Then, each kind of element portions of power line, ground line, and other groups is determined in accordance with total area of each kind of element portions in the group. If there is a different kind of element portions in each block, it is moved to other block assigned to the same kind of element portions. Thus, the same kind of element portions are arranged in each block, so that the total area is reduced on a semiconductor chip.

Hereinbelow will be described a second embodiment of this invention.

Figure 8:
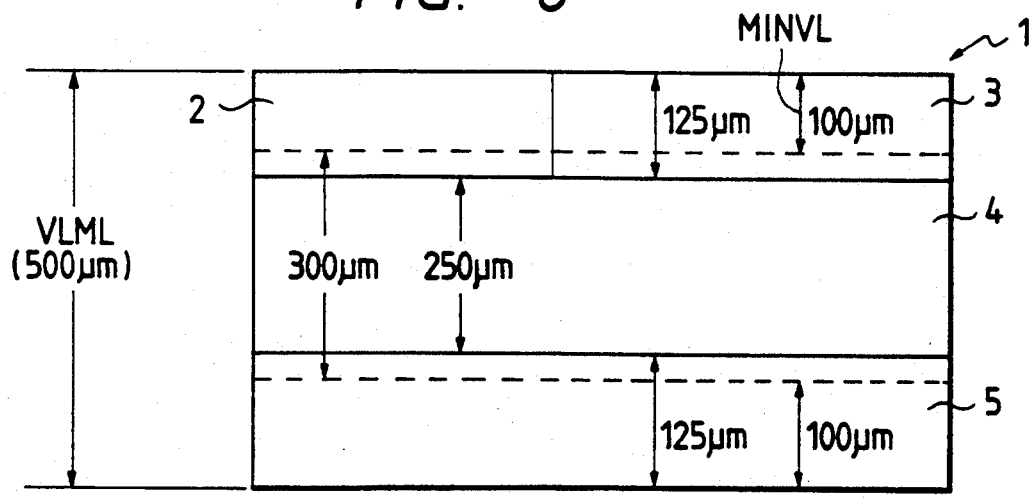
FIG. 8 is an illustration for describing a way for determination of vertical length of each block.

After determination of arrangement of element portions according to the first embodiment, the computer 601 determines vertical length of each block in step 300. A flow chart of FIG. 9 shows subroutine of step 300. FIG. 8 is an illustration for describing a way for determination of vertical length of each block.

In FIG. 9, the computer 601 starts processing in step 301. In step 301, the computer 601 receives a minimum vertical length of capacitors and resistors from the keyboard 607. In this example, 100 $\mu$m is inputted for the minimum vertical length MINVL of capacitors and resistors. In the following step 302, the computer 601 receives total vertical length of mask layout VLML from the keyboard 607. In this example, 500 $\mu$m is inputted. In step 303, a decision is made as to whether the block is a full length block produced in step 206 which will be described in a third embodiment. If YES, processing proceeds to step 304 where the computer 601 sets the vertical length to the length of the mask layout and the proceeds to step 310. In this example, the vertical length of the full length block (mask layout) is set to 500 $\mu$m as shown in FIG. 8. In step 303, if the answer is NO, processing proceeds to step 305 where the computer 601 sets the vertical length of the resistor blocks 2 and 5 and a capacitor block 3 to the inputted minimum vertical length MINVL. At first, the computer 601 determines the vertical length of the transistor block 4 because the vertical lengths of transistors are predetermined in accordance with kind or a current capacity. In the succeeding step 306, the computer 601 determines the vertical length of the transistor block 4 by subtracting the length of the resistor and capacitor blocks 2, 3 and 5 from the vertical length of the mask layout VLML. In this example, the vertical length of the transistor block 4 is set to 300 $\mu$m. In the following step 307, the computer 601 arranges transistors on the transistor block 4. In step 308, the computer 601 calculates actual vertical length for transistors arranged in step 307. In this example, the actual vertical length is set to 250 $\mu$m. In the following step 309, the computer 601 determines the final vertical length of resistor blocks and 5 and a capacitor block 3 by subtracting length of transistor blocks 4 from the length of the mask layout VLML. The reason why the vertical length is tentatively set is that if the transistors are not a few, the computer checks whether it is possible to arrange the transistors in two rows with the tentatively set vertical length. In this example, the final vertical length of the resistor blocks 2 and 5 and a capacitor block 3 is set to 125 $\mu$m respectively base on the calculation of (500−250)/2. In the step 310 following steps 304 and 309, a decision is made as to whether all blocks has been processed by steps 303-309 or 304. If NO, processing proceeds to step 311 where the computer 601 recalls data of next space and then returns to step 303. This step is made for the third embodiment. Thus, this step can be omitted in this embodiment.

Figure 11:
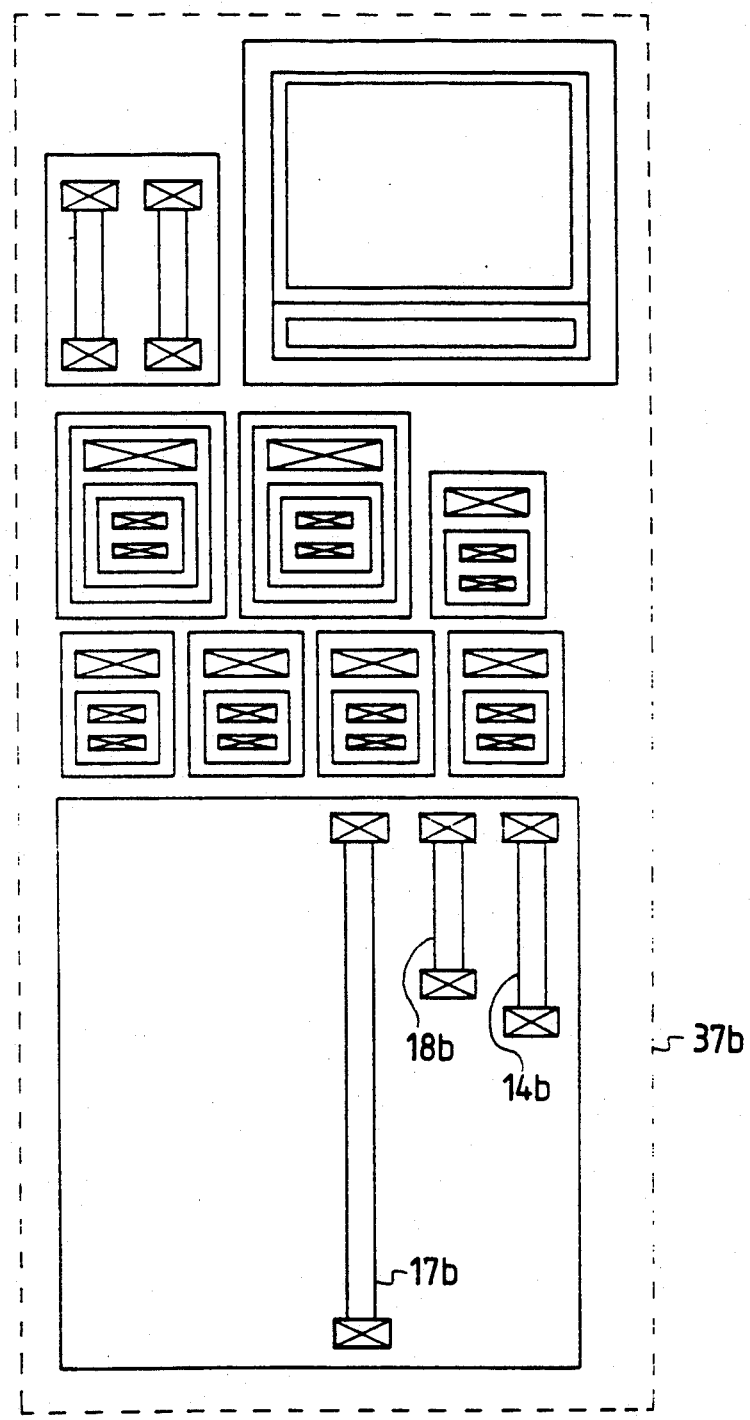
FIG. 11 is a plan view of an example mask layout before processing of a third embodiment.

Hereinbelow will be described a third embodiment of this embodiment. FIG. 10 shows a flow chart of a subroutine of the step 400 shown in FIG. 3. FIG. 11 is a plan view of an example mask layout. It is assumed that the resistor 17 shown in FIG. 7 has a large resistance. A length of the resistor 17b becomes long as shown in FIG. 11. In FIG. 11, the resistor 17b is longer than the resistors 14b and 18b. Accordingly, there is an unused space. In this embodiment, an element portion having a large length is modified to arrange it on a smaller space.

Figure 12:
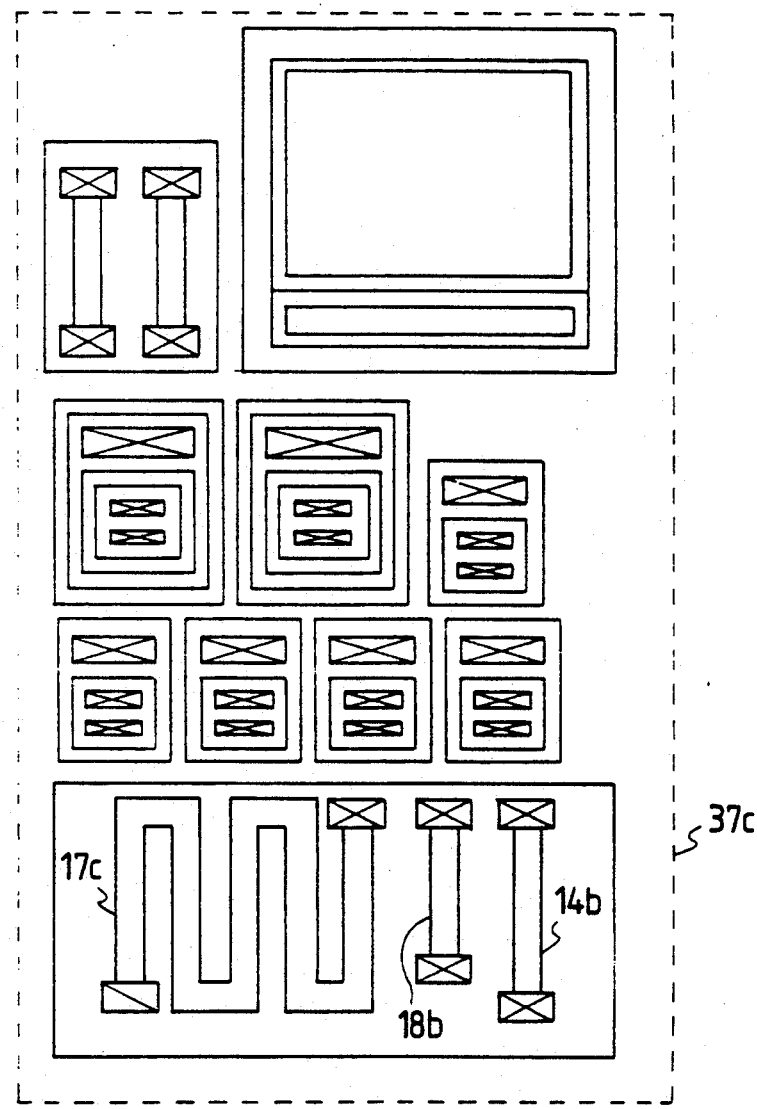
FIG. 12 is a plan view of an example mask layout after processing of the third embodiment.

Processing starts in step 401, the computer 601 resets a counter C1. In the following step, a decision is made as to whether a vertical length VL of an element portion is larger than a reference RF2 which is the vertical length of the resistor block 2 or 5, or capacitor block 3 shown in FIG. 5 or 8. If NO, processing ends. If YES, the computer 601 subtracts the reference value RF2 from the length VL in step 403. In the following step 404, the computer 601 increments C1. In step 405, if the vertical length VL is larger than RF2, processing proceeds to step 406. If NO, processing returns to step 403. In step 406, the computer 601 produces C1 strips of the resistor with the length of the reference value RF2 and a strip with the final length VL. In the following step 407, the computer 601 connects upper ends to each other or lower ends to each other to connect these strips in series, using a resistive material or conductive material, as shown in FIG. 12.

Hereinbelow will be described a fourth embodiment of this invention.

Figure 13:
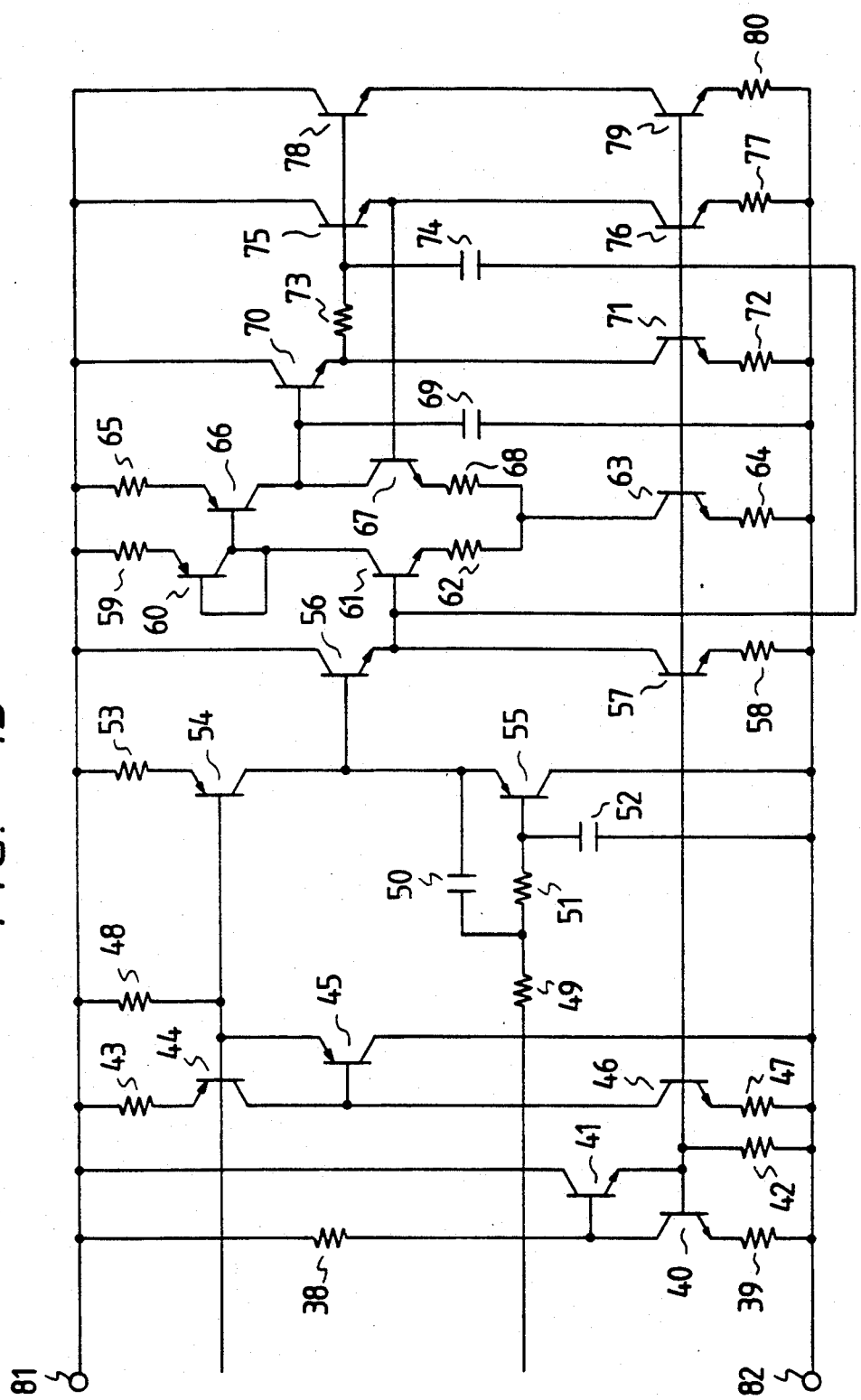
FIG. 13 is a circuit diagram to be arranged in the fourth embodiment.
Figures 14, 15:
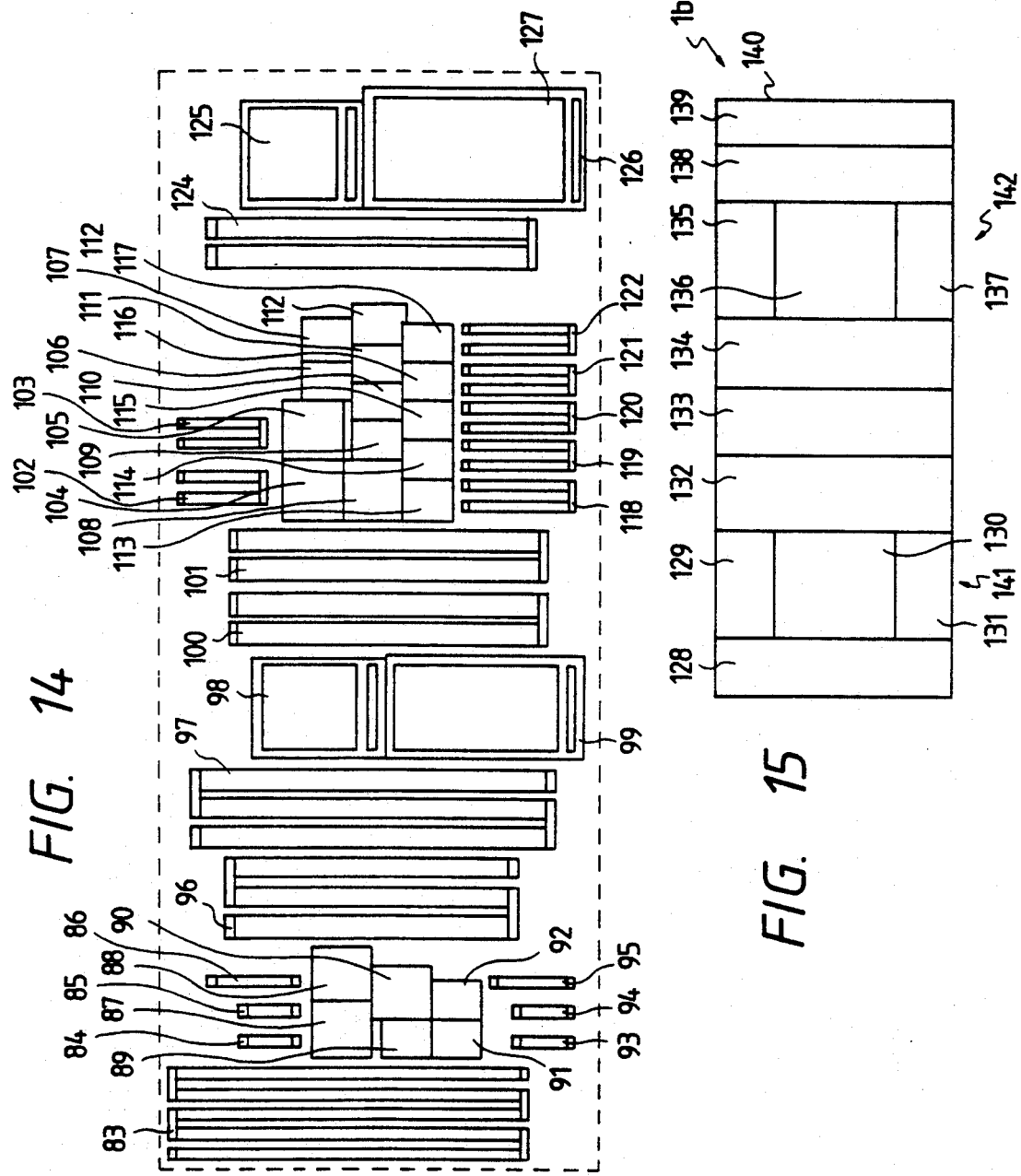
FIG. 14 is a plan view of an example mask layout after processing of the fourth embodiment.
FIG. 15 shows a rough layout of the fourth embodiment.

In this embodiment, a circuit shown in FIG. 13 is processed by this system. If the operator inputs a circuit diagram shown in FIG. 13 to the computer 601 through the graphic editor 603 or the keyboard 607, the computer 601 produces a clump 1b of blocks including full length blocks 128, 132, 133, 134, 138 and 139, a space 141 including blocks 129-131 and a space 142 including blocks 136-137, as shown in FIG. 15 and then produces a layout shown in FIG. 14.

Figure 16:
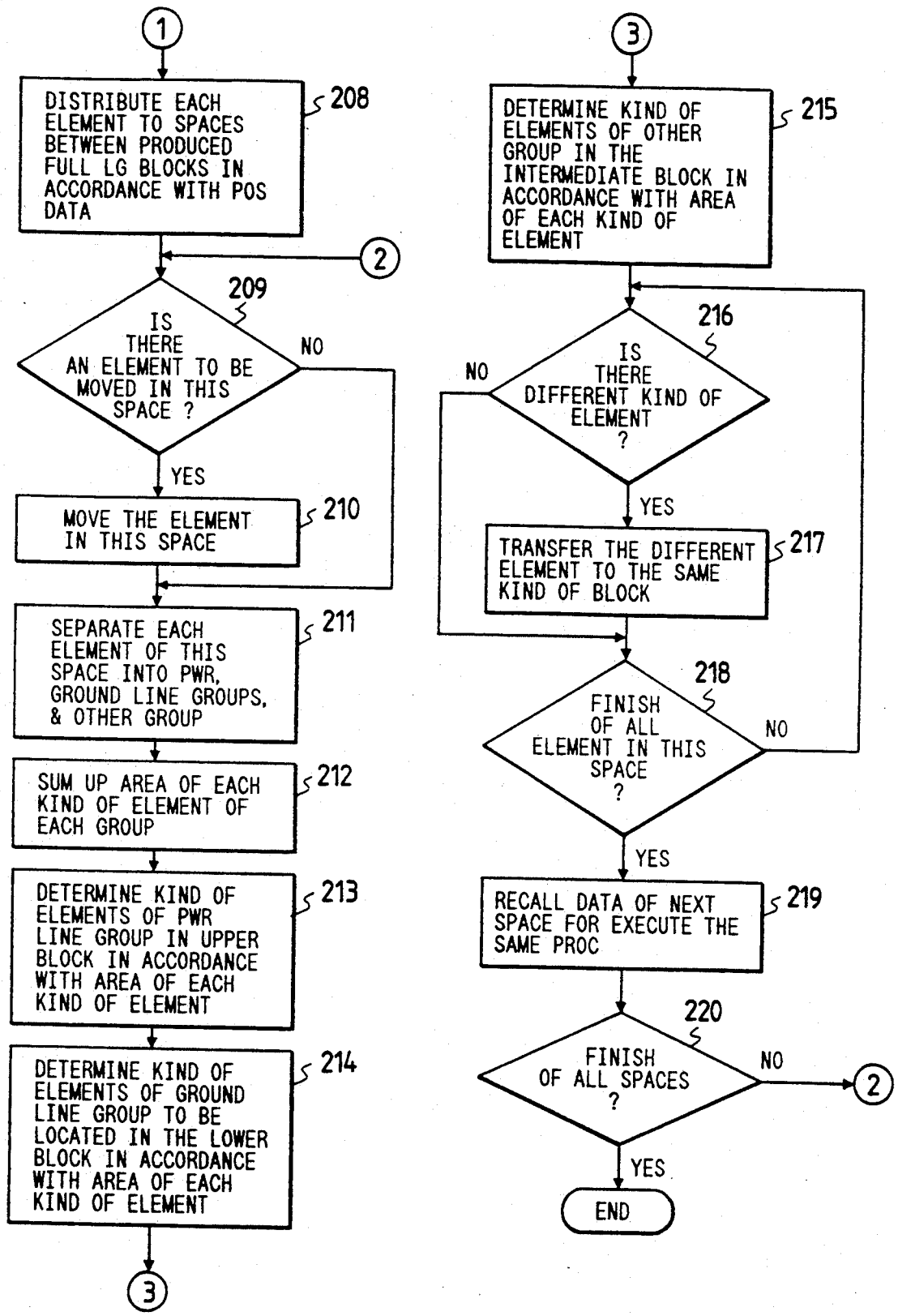
FIGS. 16A and 16B show a flow chart of the fourth embodiment.
Figure 17:
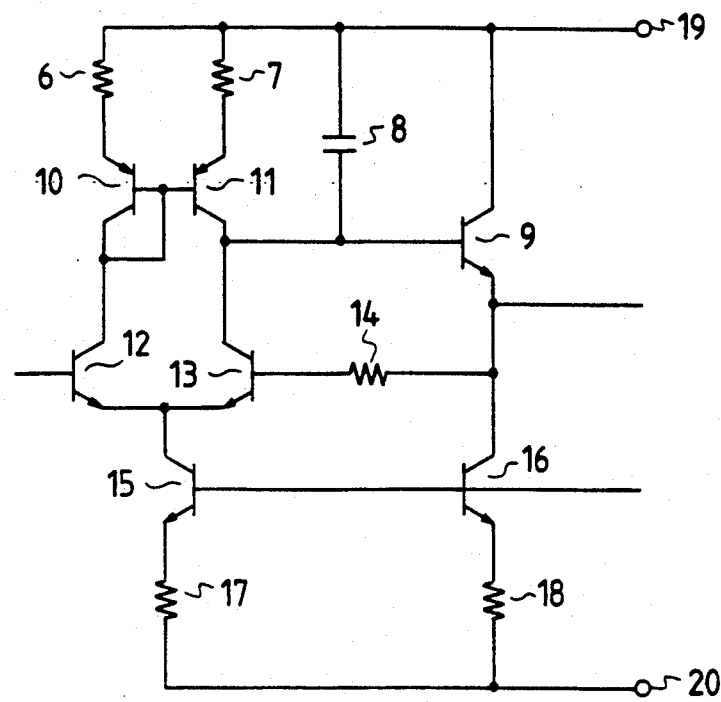
FIG. 17 shows a schematic circuit diagram of a given circuit.
Figure 18:
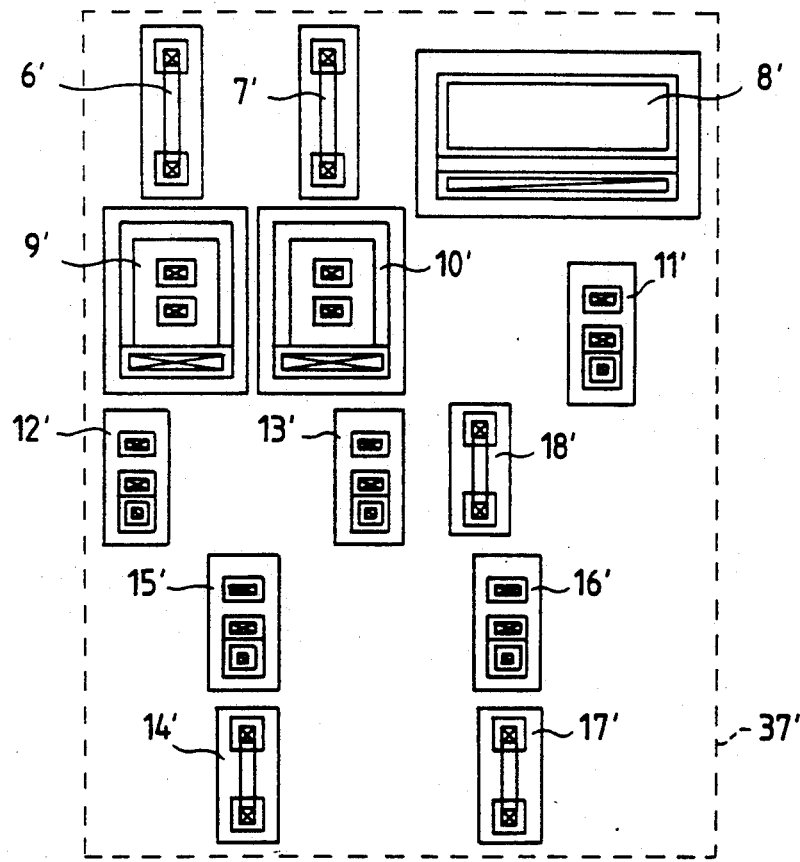
FIG. 18 is a layout of semiconductor element portions provided by this prior art method.

The computer 601 produces the layout of a circuit diagram in accordance with a main flow chart of FIG. 3. FIGS. 16A and 16B show a flow chart of subroutine step of 200 shown in FIG. 3. In FIG. 3, the computer 601 determines arrangement of element portions of the produced circuit diagram in a subroutine step 200. In the following step 300, the computer 601 determines a vertical length of each block where the same kind of element portions are located. In the succeeding step 400, the computer 601 modifies a shape of an element portion whose vertical length is grater than the vertical length of the block. In step 500, the computer 601 arranges all element portions at a suitable position finally such that each element portion belongs to one block is arranged in accordance with its x and y positions and produces a layout to display it. The processing stops after execution of the step 500.

FIGS. 16A and 16B shows a flow chart of a subroutine of step 200 shown in FIG. 3. In FIG. 16A, processing starts in step 201. In step 201, the computer 601 receives the produced circuit diagram and other data from the graphic editor 603 or circuit-diagram data and other data from the keyboard 607. In the following step 202, the computer 601 determines area of each element portion on a mask using kind and other data of element portions. In the following step 203, the computer 601 detects an element portion whose area is larger than a given value. In the succeeding step 204, the computer 601 sums up area of each kind of element portion detected in step 203. In the following step 205, a decision is made as to whether the sum obtained in step 204 is larger than a reference value RF1. If YES, the computer 601 produces a full length block with a vertical full length in the mask layout, where the element portions detected in step 205 are arranged. Then, processing proceeds to step 207. If NO, in step 205, processing proceeds to step 207 directly. For example, FIG. 15 shows a rough layout of a circuit diagram shown in FIG. 13. In FIG. 15, the full length blocks 128, 132, 133, 134, 138, and 139 are produced. The full length block 128 is provided for forming a resistor 38; the full length block 140, for resistors 49 and 51; the full length block 133, for capacitor 52; the full length block 134, for resistors 62 and 68; the full length block 138, for resistor 73; and the full length block 139, for capacitor 74. In step 207, the computer 601 makes a decision as to whether processing is executed for all element portions of the produced circuit. If NO, processing returns to step 202 and continue processing of a routing including steps 202-207 until finish of processing of all element portions. Processing proceeds to step 208 shown in FIG. 16B where the computer 601 distributes each element portion to one of spaces made between produced full length blocks 128, 132, 133, 134, 138, and 139 in accordance with position data and connection relation.

More specifically, the full length blocks 128, 132, 133, 134, 138, and 139 are arranged in accordance of their position. For example, element portions existing between element portions assigned to two adjacent full length blocks 128 and 132 in the produced circuit diagram are arranged in the space including blocks 129, 130, and 131 between the full length blocks 128 and 132. In other words, element portions exist between the resistor 38 and the resistors 49 and 51 in the circuit diagram of FIG. 13 are arranged in space 141.

In the succeeding step 209, a decision is made as to whether an element portion in other spaces should be moved in this space by checking whether wiring length of the element portion becomes smaller if such element portion would be moved to this space. In the following step 210, the computer 601 moves the such element portion to this space. The pair of pair transistors is also moved into this space in this step if another pair exists in this space. Then, processing proceeds to step 211, and in step 209, the answer is NO, the processing proceeds to step 211 directly. In step 211, the computer 601 separates each element portion of this space into power, ground line groups, and other group in accordance with connection relation in the same manner as the first embodiment. In the following step 212, the computer 601 sums up area of each kind of element portion of each group. The computer 601 determine a kind of element portions to be arranged at the upper block 129 in accordance with the total area of each kind of element portions of the group in step 213. In the upper block 129, a kind of element portions with the largest area out of element portions of the power line group are arranged. Similarly, in step 214, the computer 601 determine a kind of element portions to be arranged at the lower block 131 in accordance with the total area of each kind of element portions of the ground line group. In the lower block 131, a kind of element portions with the largest area out of element portions of the ground line group are arranged. The computer 601 determines a kind of element portions to be arranged at the middle block 130 in accordance with the total area of each kind of element portions of the rest group in step 215. In the middle block 130, a kind of element portions with the largest area out of element portions of the group are arranged. In the following step 216, the computer 601 detects whether there is a different kind of element portion in each block. If YES, in step 217, the computer 601 transfers the different kind of element portion to the block where the same kind of element portions are arranged. Actually, at first, the computer 601 detects which block in this space is assigned to the same kind of element portion as the different kind of element portion is detected in step 216. Then, the computer 601 moves the different kind of element portion to the detected block. In step 218, the computer 601 makes a decision as to whether all element portions in this space have been checked. If NO, processing returns to step 216. If YES, processing proceeds to step 219. In step 219, the computer 601 recalls data of the next space, for example, space 142, to begin execution of the same processing of steps 209–218. In step 220, the computer 601 makes a decision as to whether all spaces 141 and 142 have been checked. If NO, processing returns to step 209 until all spaces have been checked. If YES, processing ends this subroutine and returns to step 300 of the main routine.

In step 300, the computer 601 determines vertical length of each block. In step 303 a step of the subroutine step 300 shown in FIG. 9, a decision is made as to whether the block is a full length block produced in step 206. If YES, processing proceeds to step 304 where the computer 601 sets the vertical the vertical length to length of the mask layout and the proceeds to step 310. In the step 310, a decision is made as to whether all blocks has been processed by steps 303-309 or 304. If NO, processing proceeds to step 311 where the computer 601 recall data of next space and then returns to step 303 until finish of processing of all blocks. In the following step 400, the computer 601 modifies a shape of an element portion if the vertical length of an element portion is larger than the vertical length of the block where the element portion is to be arranged. In the following step 500, the computer 601 arranges element portion at each block in accordance with their X and Y positions and connection relation and produce the mask layout of FIG. 14 to display it on the display 605.

Therefore, in the clump 1b of blocks, an element 83 is arranged in the full length block 128; elements 96 and 97 are arranged in the full length block 132; element 98 and 99 are arranged in the full length block 133; elements 100 and 101 are arranged in the full length block 134; an element 124 is arranged in the full length block 138; elements 125 and 126 are arranged in the full length block 139; elements 84–86 are arranged in the block 129; elements 87–92 are arranged in the block 130; elements 93–95 are arranged in the block 131; elements 102–103 are arranged in the block 135; elements 104–117 are arranged in the block 136; and elements 112–122 are arranged in the block 137.

What is claimed is:

1. A method for positioning circuit elements for a semiconductor integrated circuit on the basis of inputted circuit configuration data which represent kind, attribute data and location of each circuit element to be included in said semiconductor integrated circuit, using a computer, comprising the steps of:

(a) positioning a plurality of blocks arranged side by side in one direction of the semiconductor integrated circuit such that one or more blocks includes circuit elements to be directly connected to a common line in said semiconductor integrated circuit;

(b) obtaining a total area of each kind of circuit element in each of said blocks;

(c) determining a kind of circuit element to be arranged in each of said blocks in accordance with said total area obtained in connection with said each kind;

(d) detecting at least one circuit element different from the determined kind of said circuit element in each of said blocks if any;

(e) transferring the detected different kind of circuit element from said each block to a block including the same kind of said circuit element arranged therein; and (f) for each of said blocks arranging said circuit elements determined after said step of transferring so that each circuit element is located at a suitable position in accordance with said location data of said circuit elements to produce said layout.

2. A method as claimed in claim 1, wherein said circuit elements comprise a resistor whose said attribute data includes resistance and a capacitor whose said attribute data includes capacitance.

3. A method as claimed in claim 1, further comprising the step of producing a layout image for positioning said circuit elements by replacing each circuit element arranged in step (f) with a predetermined pattern in accordance with kind and attribute data of said each in circuit element.

4. A method as claimed in claim 1, wherein said common line is a power source line.

5. A method as claimed in claim 1, comprising the further step of assigning circuit elements to said blocks such that a first block of said blocks includes circuit elements connected to a positive power source line, a second block of said blocks includes circuit elements connected to a negative power source line, and a third block of said blocks includes circuit elements not connected to said positive and negative power source lines.

6. A method as claimed in claim 1, wherein said circuit elements include resistor elements, capacitor elements, and transistor elements.

7. A method as claimed in claim 6, further comprising the steps of:

(a) providing a minimum length of first blocks to which said resistor elements and said capacitor elements are assigned and providing a total length of said blocks;

(b) determining a preliminary length of said first blocks;

(c) determining a length of a second block of said blocks, to which said transistor elements are assigned, in accordance with the maximum length of said transistor elements determined by said kind and attribute data and by a difference between said total length of blocks and said length of said first blocks; and (d) determining a final length of said first blocks in accordance with a difference between the length of said second block and said total length of said blocks.

8. A method as claimed in claim 7, further comprising the step of:

modifying a shape of one of said circuit elements when a vertical length of said one of said circuit elements obtained in accordance with said attribute data of said one of said elements exceeds said vertical length determined in step (d) of claim 7.

9. A method for producing a layout of circuit elements for a semiconductor integrated circuit on the basis of inputted circuit configuration data which represent kind, attribute data and location of each circuit element to be included in said semiconductor integrated circuit, using a computer programmed to perform the steps of:

(a) establishing a vertical length of said circuit elements in accordance with input circuit configuration data;

(b) detecting a circuit element whose obtained vertical length exceeds a predetermined value;

(c) producing a first block with full vertical length in response to detection of step (b);

(d) forming a plurality of vertically extending sections of said circuit and defining a boundary between two consecutive sections in accordance with a horizontal position of said circuit element detected in step (b);

(e) producing a set of second blocks for arranging said circuit elements belonging to said each section other than sections including said circuit element detected in step (b), and arranging said second blocks side by side in the vertical direction such that one or more blocks include circuit elements to be directly connected to a common line in said semiconductor integrated circuit;

(f) obtaining a total area of each kind of circuit element in each of said blocks, and selecting an area of each circuit element in accordance with said kind of and said attribute data of said each circuit element;

(g) determining a kind of circuit element to be arranged in each of said blocks in accordance with said total area obtained in connection with said each kind;

(h) detecting at least one circuit element different from the determined kind of said circuit element in each of said blocks if any;

(i) transferring the detected different kind of circuit element from said each block to a block including the same kind of said circuit element arranged therein; and (j) for each of said blocks arranging said circuit elements determined after said step of transferring so that each circuit element is located at a suitable position in accordance with said location data of said circuit elements to produce said layout.

10. A method as claimed in claim 9, wherein said circuit elements comprise a resistor whose said attribute data includes resistance and a capacitor whose said attribute data includes capacitance.

11. A method as claimed in claim 9, further comprising the step of producing a layout image for positioning said circuit elements by replacing each circuit element arranged in step (j) with a predetermined pattern in accordance with kind and attribute data of said each in circuit element.

12. A method as claimed in claim 9, wherein said common line is a power source line.

13. A method as claimed in claim 9, comprising the further step of assigning circuit elements to said blocks such that a first block of said blocks includes circuit elements connected to a positive power source line, a second block of said blocks includes circuit elements connected to a negative power source line, and a third block of said blocks includes circuit elements not connected to said positive and negative power source lines.

14. A method as claimed in claim 9, wherein said circuit elements include resistor elements, capacitor elements, and transistor elements.

15. A method as claimed in claim 14, further comprising the steps of:

(a) providing a minimum vertical length of first blocks of said blocks, to which said resistor elements and said capacitor elements are assigned and providing a total vertical length of said blocks;

(b) determining a preliminary vertical length of said first blocks;

(c) determining a vertical length of a second block of said blocks, to which said transistor elements are assigned, in accordance with the maximum vertical length of said transistor elements determined by said kind and attribute data and by a difference between said total vertical length of blocks and vertical length of said first blocks; and (d) determining a final vertical length of said first blocks in accordance with a difference between the vertical length of said second block and said total length of said blocks.

16. A method as claimed in claim 15, further comprising the step of:

modifying a shape of one of said circuit elements when a vertical length of said one of said circuit elements obtained in accordance with said attribute data of said one of said elements exceeds said vertical length determined in step (d) of claim 15.

* * * * *